United States Patent [19]

Cruise et al.

[11] Patent Number: 4,538,868
[45] Date of Patent: Sep. 3, 1985

[54] TERMINAL BLOCK

[75] Inventors: Thomas W. Cruise, Coon Rapids; Thomas N. Milbrandt, Lakeville, both of Minn.

[73] Assignee: Magnetic Controls Company, Minneapolis, Minn.

[21] Appl. No.: 415,025

[22] Filed: Sep. 7, 1982

[51] Int. Cl.³ ............................................ H01R 13/44
[52] U.S. Cl. .................................. 339/34; 339/126 R; 339/198 R; 16/373
[58] Field of Search ............... 339/119, 126 R, 198 R, 339/34; 16/373

[56] References Cited

U.S. PATENT DOCUMENTS

| | | | |
|---|---|---|---|
| 546,304 | 9/1895 | Davidson | 16/373 |
| 3,784,728 | 1/1974 | DeBortoli et al. | 339/198 R |
| 3,904,936 | 9/1975 | Hamrick, Jr. et al. | 339/34 |
| 4,012,096 | 3/1977 | DeLuca et al. | 339/276 A |
| 4,390,002 | 6/1983 | Daily, III | 16/373 |
| 4,420,208 | 12/1983 | Holland et al. | 339/126 R |

Primary Examiner—Gil Weidenfeld
Assistant Examiner—Paula Austin
Attorney, Agent, or Firm—Dorsey & Whitney

[57] ABSTRACT

A terminal block having a housing, a connector panel rotatably mounted between the side walls of the housing between first and second positions, a latch mechanism for releasably retaining the panel in its first or second position and a front door pivotally secured to the housing.

8 Claims, 5 Drawing Figures

TERMINAL BLOCK

BACKGROUND OF THE INVENTION

The present invention relates generally to a terminal block, and more particularly, to a terminal block adapted for use in fields such as telecommunications and data transmission.

Various types of terminal blocks presently exist in the prior art for use in fields of art such as telecommunications and data transmission. The function of these terminal blocks includes receiving a plurality of incoming electrical leads (often several hundred) and providing means for organizing those leads for readily accessing such leads and crosspatching various leads with one another.

A preferred terminal block should provide means for readily connecting the various incoming leads to a connector panel or the like and means for identifying and organizing those incoming leads. It is also preferable to keep the terminal block structure as compact as possible, thus minimizing the space required to house the terminal block unit. While efforts have been made to construct terminal blocks with the above objectives in mind, there are still further improvements that can be achieved. Accordingly, there continues to be a need for a terminal block which accomplishes the above-identified objectives.

SUMMARY OF THE INVENTION

The present invention provides an improved terminal block construction which provides quick and easy access to the various incoming leads and also provides means for quickly and easily connecting the same to the back side of the terminal block connector panel. Specifically, the structure of the present invention includes a terminal block panel having connector elements accessible from both the rearward and the forward surface of the panel. Means are provided for rotating the panel about a pivot point and maintaining the same in that position to provide access to the rearward surface for connection of the incoming leads. The panel is then rotated back to its normal position to provide quick and easy access to the connector elements on the front surface of the panel.

Means are also provided for pivotally securing the front panel door to the terminal block housing. This means includes a unique wire hinge element which also functions to secure a lead designation chart or table to the inside surface of the front panel door. The present invention also provides a terminal block which is connectorized in that it includes a plurality of electrical connector elements to receive the incoming leads. These connector elements are arranged in a pattern offset from one another to permit maximum density of connector elements in the terminal block. This enables the terminal block structure to be kept as compact as possible. A further feature of the present invention is the provision of a plurality of elongated access openings on the connector element chassis to provide front side access to the various connectors within the terminal block.

Accordingly, it is an object of the present invention to provide an improved terminal block which is as compact as possible and which provides quick and easy access to both the front and rear surfaces of the terminal block connector panel.

Another object of the present invention is to provide a means for facilitating the quick and easy connection of various leads to the connector panel.

A further object of the present invention is to provide a unique hinge mechanism for the terminal block forward door panel which also functions as a designation card holder.

Another object of the present invention is to provide a connector mounting chassis which permits maximum density of connectors and which also provides ready access to the connectors from the front side of the chassis.

These and other objects of the present invention will become apparent with reference to the drawings, the description of the preferred embodiment and the appended claims.

DESCRIPTION OF THE PREFERRED EMBODIMENT

Figure 1:
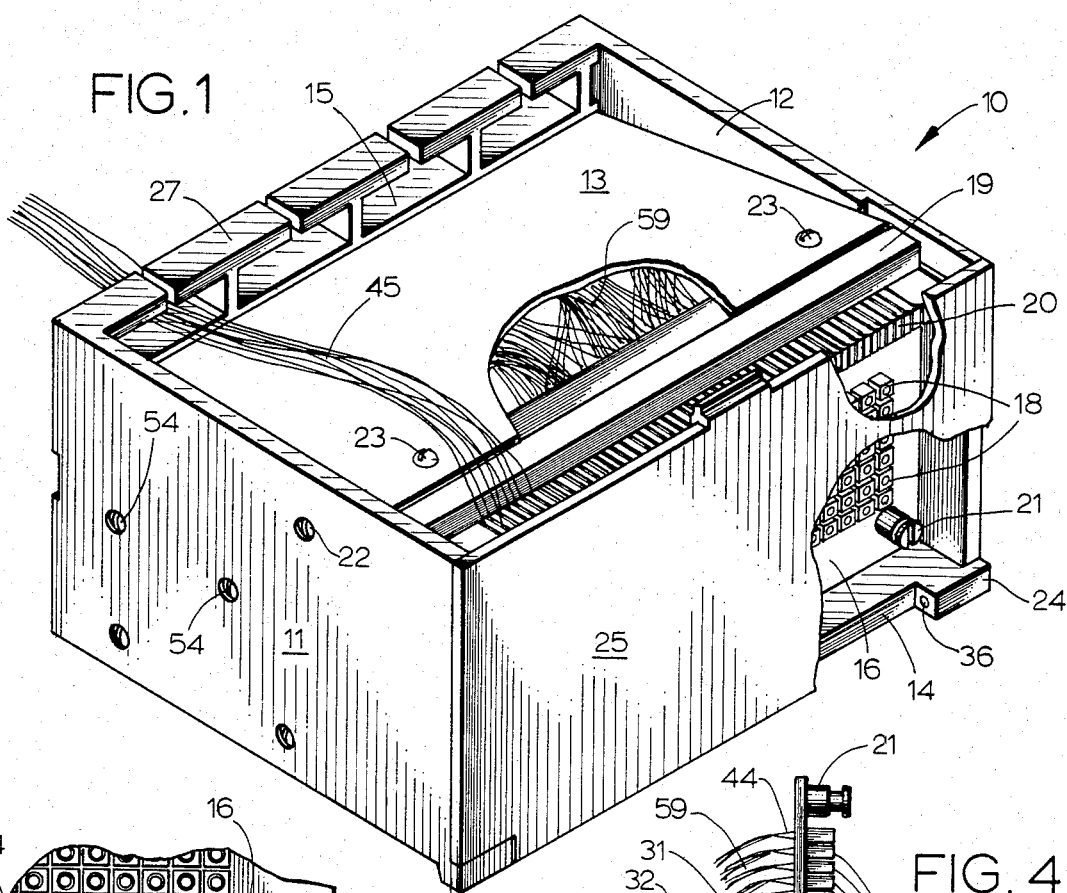
FIG. 1 is a pictorial view of the terminal block of the present invention with portions of the front door and top cover broken away.
Figure 2:
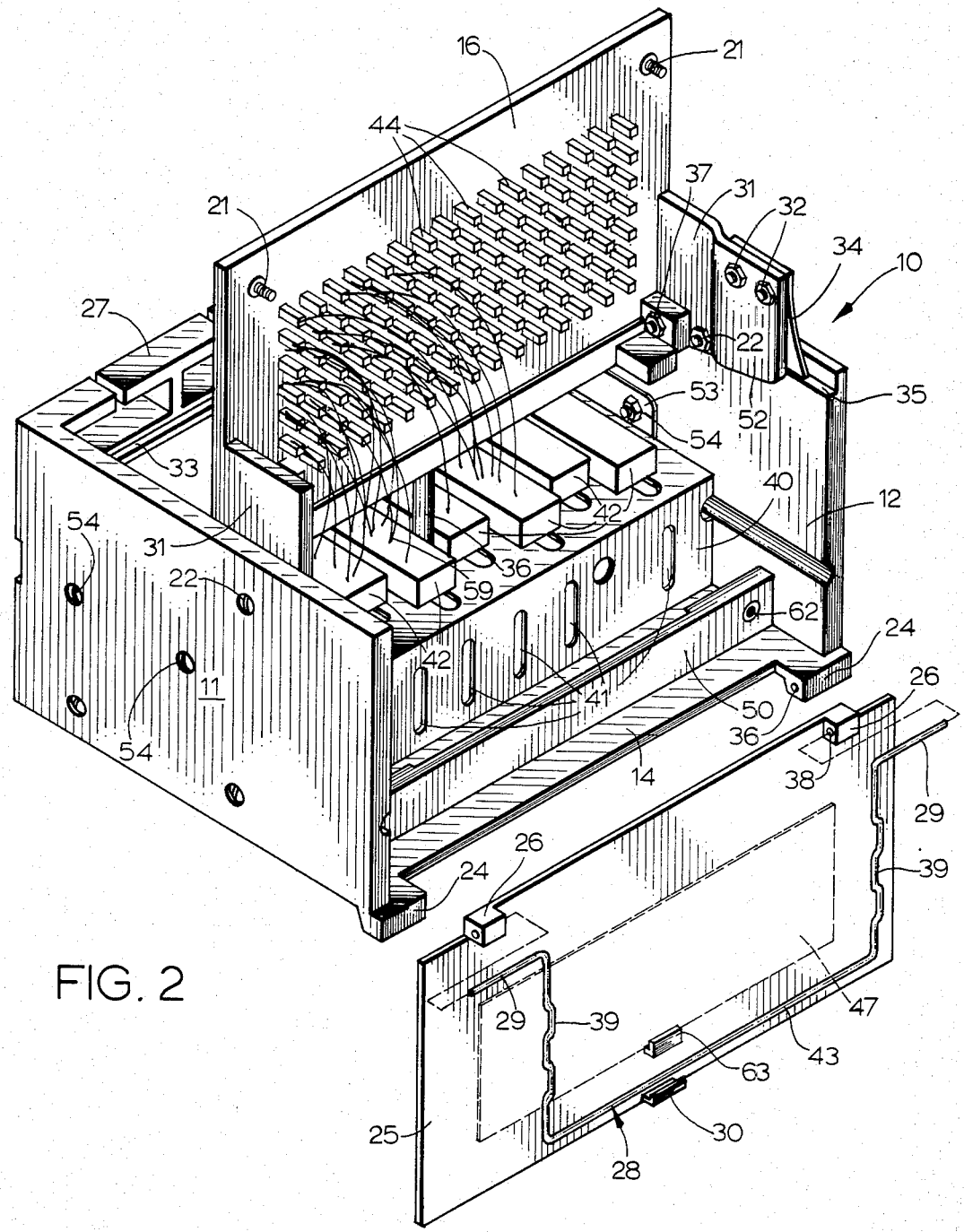
FIG. 2 is a pictorial view similar to FIG. 1 with the front door open and removed from the housing and the connector panel pivoted to its second position.

The terminal block of the present invention is identified by the reference numeral 10 and is illustrated best in FIGS. 1 and 2. As shown, the terminal block 10 includes a housing comprising a pair of parallel side walls 11 and 12, a bottom wall 14 and a rearward wall 15. The bottom wall 14 extends between the side walls 11 and 12 and is positioned near the forward end of the terminal block 10. The rearward wall 15 extends between the side walls 11 and 12 along their rearward edge. The terminal block 10 also includes a rotatable connector panel 16 and a connector chassis 40. The connector panel 16 is rotatably mounted between the side walls 11 and 12 by the threaded members 22. The axis of rotation is perpendicular to the side walls 11 and 12. When fully assembled as shown in FIG. 1, the housing includes a top cover portion 13 having its rearward edge adapted for insertion into the slot 33 (FIG. 2) and its forward end secured to the top portion 19 of the fanning strip 20. The cover 13 is secured to the top portion 19 by a pair of screws 23, 23.

As illustrated best in FIG. 1, the panel member 16 is rectangularly shaped and includes a plurality of connector elements 18 arranged in a grid pattern. These connector elements 18 can be any of several conventional connector elements such as split cylinder type connectors or the like. In the preferred embodoment, the connector members 18 comprise a plastic housing surrounding a split cylinder type connector. The purpose of these connectors 18 is to facilitate access to and selective cross patching and cross connection of various incoming telecommunication or data transmission leads. The panel 16 has a relatively flat forward surface on which the connector elements 18 are mounted, a flat rearward surface (FIG. 2) from which the back side 44 of the connectors 18 extend and a panel top 19 securely connected with the panel by a pair of threaded members 37 (FIG. 2). The panel top 19 includes a forwardly disposed fanning strip 20 for separating sets of wires from one another and for guiding the same from the forward surface of the panel 16 rearwardly to the rearward fanning strip 27. As illustrated in FIGS. 1 and 2, the rearward fanning 27 is integrally formed with the rearward wall 15.

The terminal block 10 also includes a forwardly disposed, hinged front door 25 which is pivotally secured to a pair of tab portions 24, 24 extending forwardly and outwardly from a portion of the bottom wall 14. The door 25 is a relatively rectangular shaped element having a pair of block portions 26, 26 secured to the inward face of the door 25. Each of the portions 26, 26 and the tabs 24, 24 includes a hole 38 and 36, respectively (FIG. 2), to receive opposite ends 29, 29 (FIG. 2) of a wire hinge member 28. The wire hinge 28 is constructed of a single piece of wire and is bent in the manner illustrated in FIG. 2 with a pair of oppositely extending end portions 29, 29 and an intermediate portion comprising a pair of side sections 39, 39 extending at right angles to the ends 29, 29 and a central portion 43 extending between the side sections 39, 39. When the ends 29, 29 are inserted into the holes 38, 38 and 36, 36, the door 25 becomes pivotally secured with respect to the terminal block housing. The door 25 also includes a hinge retaining tab 63 adapted to retain the wire hinge member 28 in engagement with the front door 25 so that it functions to retain a designation card 47 or the like with respect to the door 25. It should be noted that the side sections 39, 39 of the wire hinge member 28 include a plurality of curves, thus resulting in the exertion of a force against the designation card 47 to hold the same with respect to the door 25. The door 25 also includes a latch member 30 adapted for latching engagement with a notched portion of the fanning strip 20.

The connector panel 16 is mounted for pivotal movement with respect to the side walls 11 and 12 by the threaded members 37. The panel 16 is rotatable between a first position illustrated in FIG. 1 in which access to the connector portions 18 on the forward surface of the panel 16 is provided and a second position illustrated in FIG. 2 in which access to the connector portions 44 on the rearward surface of the panel 16 is provided. The panel 16 is releasably retained in its first position by a pair of threaded members 21, 21 which extend through the panel 16 and into a pair of corresponding openings 62 in the base support member 50.

Figure 3:
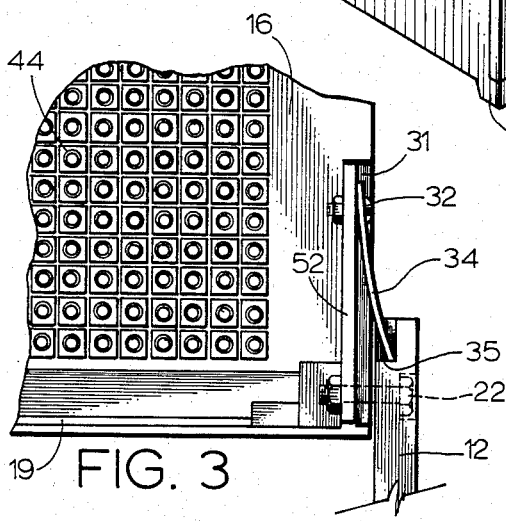
FIG. 3 is an elevational view of a portion of the connector panel showing the latch means for retaining the connector panel in its second position.
Figure 4:
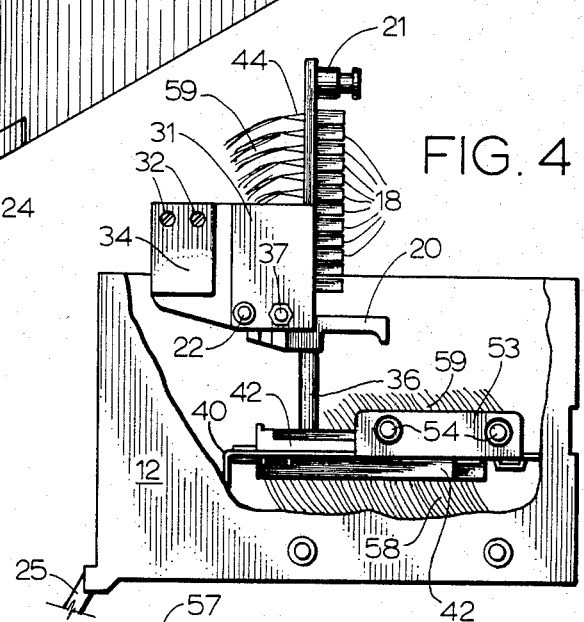
FIG. 4 is an elevational side view, with portions broken away, of the terminal block of the present invention with the connector panel in its second position.

As shown best in FIGS. 2, 3 and 4 the panel 16 is releasably retained in its second position by a retaining means which includes the stop member or stand-off 36 and the latch member 34. This facilitates access to the rearward surface of the panel 16 which in turn facilitates electrical connection of a plurality of connecting wires 59 extending from the connectors 42 (FIG. 2).

With continuing reference to FIG. 2, the panel 16 includes a pair of side tab portions 31, 31 extending rearwardly from the panel to enable pivotal mounting of the panel 16 to the side walls 11 and 12. One of the brackets 31 (the one positioned to the right in FIG. 2) includes an extension 52 to which the latch member 34 is mounted. As illustrated, the latch member 34 is mounted to the tab extension 52 by a pair of threaded members 32, 32. As shown best in FIG. 3, the lower end of the latch member 34 is biased outwardly away from the extension 52 so that it engages the shoulder portion 35 in the side wall 12 when the panel 16 is pivoted to its second position illustrated in FIG. 2. When the panel reaches this position, the latch member 34 snaps outwardly and engages the shoulder 35, thus precluding pivotal movement of the panel 16 in a direction toward the first position. The latch 34 is released by manually depressing the latch member 34 so that its bottom portion no longer rests on the shoulder 35. When this is done, the panel 16 can be pivoted forwardly and downwardly toward its first position illustrated in FIG. 1. Pivotal movement of the panel 16 in a direction away from the first position is limited by the stop member or stand-off 36. The stop member 36 is engaged by a portion of the panel top 19.

Figure 5:
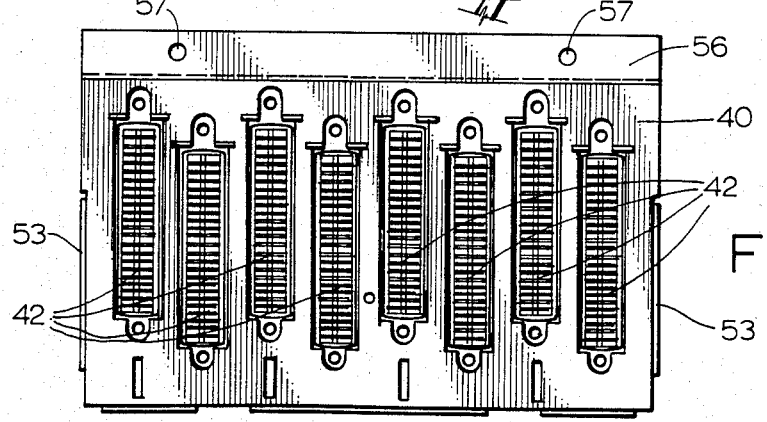
FIG. 5 is an elevational bottom view of the connector chassis portion of the present invention showing the connector elements secured to the chassis.

The terminal block 10 also includes a connector chassis 40 illustrated best in FIGS. 2, 4 and 5. The chassis 40 includes a forwardly extending mounting tab 56 and a pair of upwardly extending mounting tabs 53, 53 for purposes of mounting the chassis 40 to the housing. The tab 56 includes openings 57 for mounting to a portion of the bottom wall 14 and the tabs 53, 53 include openings for connection to the side walls 11 and 12. A plurality of threaded members 54 extend through these openings and through the side walls 11 and 12.

The chassis 40 includes a plurality of connectors 42 mounted to the chassis 40 in the manner shown in FIGS. 2 and 5. The connectors 42 are conventional connectors which are offset from one another to provide maximum connector density. Each of the connectors 42 receives a plurality of incoming leads 58 (FIG. 4). A similar number of leads 59, corresponding to the leads 58, extend from the connectors 42 to the connector portions 44 on the rearward surface of the panel 16. As shown in FIG. 2, the forward wall of the chassis 40 is provided with a plurality of elongated openings 41. These openings 41 correspond to the connectors 42 to provide side access for the purpose of facilitating connection and removal of mating connectors 42.

Having described the structure of the preferred embodiment in detail, the operation can be understood as follows. First, the connectors 42 with incoming leads 58 and connecting leads 59 are mounted in the chassis 40 in a conventional manner. Following this, the panel 16 is pivoted upwardly to the position illustrated in FIG. 2. This provides access to the connector portions 44 on the rearward surface of the panel 16. Each of the connector wires 59 from the connectors 42 is then connected with one of the connector portions 44. If the connector portions 44 are split cylinder connectors as in the preferred embodiment, a special tool is utilized. The stop member 36 resists the insertion force developed during this connecting process. After these connections are made, the latch 34 is manually released and the panel 16 is pivoted downwardly to the position illustrated in FIG. 1 and the screws 21, 21 rotated to secure the panel in this position.

As this point, connecting wires 45 are connected with each of the connectors 18 on the forward surface of the panel 16. These wires 45 are then connected with other connectors 18 (crosspatched) or are directed outwardly through the fanning strip 20, over the cover 13 and then through the rearward fanning strip 27, to some remote location.

Although the description of the preferred embodiment has been quite specific, it is contemplated that various changes could be made without deviating from the spirit of the present invention. Accordingly, it is intended that the scope of the present invention be defined by the appended claims rather than by the description of the preferred embodiment.

We claim:

1. A terminal block comprising:
   a housing having a pair of generally parallel side walls, each of said side walls having a lower forward corner;
   a connector panel with forward and rearward surfaces rotatably mounted between said side walls about a first axis perpendicular to said side walls, said connector panel including a plurality of connector elements providing connection portions on both its forward and rearward surfaces and being rotatably moveable between a first position in which access to the connection portions on the forward surface of said panel is provided and a second position in which access to the connection portions on the rearward surface of said panel is provided;
   first means for releasably retaining said connector panel in its first position;
   second means for releasably retaining said connector panel in its second position; and
   a front door having an inside and an outside surface pivotally secured to said housing near the lower, forward corner of said side walls by a wire hinge member and about a second axis generally parallel to said first axis, said wire hinge member comprising a pair of ends lying on a common axis for pivotally securing said front door to said housing and an intermediate section integrally joined with said pair of ends and extending over a portion of the inside surface of said front door, each of said pair of ends extending through a portion of said front door and a portion of said housing.

2. The terminal block of claim 1 including a connector chassis mounted to said housing between said side walls.

3. The terminal block of claim 1 wherein said second means includes a stop member for limiting the rotational movement of said connector panel in a direction away from said first position.

4. The terminal block of claim 3 wherein said second means further includes a latch means for selectively limiting the rotational movement of said connector panel in a direction toward said first position.

5. A terminal block comprising:
   a housing having a pair of generally parallel side walls, each of said side walls having a lower forward corner;
   a connector panel with forward and rearward surfaces rotatably mounted between said side walls about an axis perpendicular to said side walls, said connector panel including a plurality of connector elements providing connection portions on both its forward and rearward surfaces and being rotatably moveable between a first position in which access to the connection portions on the forward surface of said panel is provided and a second position in which access to the connection portions on the rearward surface of said panel is provided;
   first means for releasably retaining said connector panel in its first position;
   second means for releasably retaining said connector panel in its second position; and
   a front door having an inside and an outside surface pivotally secured to said housing near the lower, forward corner of said side walls by a wire hinge member comprising a pair of ends lying on a common axis for pivotally securing said front door to said housing and an intermediate section integrally joined with said pair of ends and extending over a portion of the inside surface of said front door, said intermediate section including means for retaining a connector designation card.

6. The terminal block of claim 5 including a latching tab connected with said front door for retaining said intermediate section in engagement with the inside surface of said front door.

7. A terminal block comprising:
   a housing having a pair of generally parallel side walls, each of said side walls having a lower forward corner;
   a connector panel with forward and rearward surfaces rotatably mounted between said side walls and about an axis perpendicular to said side walls, said connector panel including a plurality of connector elements providing connection portions on both its forward and rearward surfaces and being rotatably moveable between a first position in which access to the connection portions on the forward surface of said panel is provided and a second position in which access to the connection portions on the rearward surface of said panel is provided;
   first means for releasably retaining said connector panel in its first position;
   second means for releasably retaining said connector panel in its second position;
   a front door having an inside and an outside surface pivotally secured to said housing near the lower, forward corner of said side walls; and
   a connector chassis immovably mounted to said housing between said side walls, said connector chassis including a plurality of multicontact connectors mounted in side-by-side relationship with adjacent multicontact connectors being offset with respect to one another to provide maximum multicontact connector density, said multicontact connectors being in addition to said plurality of connector elements included on said connector panel.

8. The terminal block of claim 7 wherein said connector chassis includes a forward edge having a plurality of elongated openings to provide front side access to said connectors for securing and removing mating connectors.

* * * * *